United States Patent
Kim et al.

(10) Patent No.: US 8,537,606 B2
(45) Date of Patent: Sep. 17, 2013

(54) READ SENSING CIRCUIT AND METHOD WITH EQUALIZATION TIMING

(75) Inventors: Jung Pill Kim, San Diego, CA (US); Tae Hyun Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 228 days.

(21) Appl. No.: 13/033,109

(22) Filed: Feb. 23, 2011

(65) Prior Publication Data

US 2012/0188817 A1 Jul. 26, 2012

Related U.S. Application Data

(60) Provisional application No. 61/435,185, filed on Jan. 21, 2011.

(51) Int. Cl.
*G11C 11/14* (2006.01)
*G11C 7/00* (2006.01)

(52) U.S. Cl.
USPC ........................... 365/171; 365/194; 365/158

(58) Field of Classification Search
USPC .................... 365/171, 194, 158, 195, 161
See application file for complete search history.

(56) References Cited

U.S. PATENT DOCUMENTS

| | | | |
|---|---|---|---|
| 5,982,666 A | 11/1999 | Campardo | |
| 6,205,072 B1 | 3/2001 | Jung | |
| 6,469,929 B1 | 10/2002 | Kushnarenko et al. | |
| 6,580,298 B1 | 6/2003 | Subramanian et al. | |
| 7,161,861 B2 | 1/2007 | Gogl et al. | |
| 2006/0092689 A1 | 5/2006 | Braun et al. | |
| 2008/0048728 A1* | 2/2008 | Hong et al. | 327/51 |
| 2008/0186786 A1 | 8/2008 | Lin | |
| 2010/0165710 A1 | 7/2010 | Nahas et al. | |

FOREIGN PATENT DOCUMENTS

EP     0301588 A2    2/1989

OTHER PUBLICATIONS

International search report and written opinion—PCT/US2012/022239—ISA/EPO—Apr. 5, 2012.

* cited by examiner

*Primary Examiner* — Son Dinh
*Assistant Examiner* — Uyen B Tran
(74) *Attorney, Agent, or Firm* — Sam Talpalatsky; Nicholas J. Pauley; Joseph Agusta (57) ABSTRACT

A Magnetic Random Access Memory (MRAM) includes read sensing circuitry having an equalizer device configured between a bit cell output node and a reference node of the bit cell. The equalizer is turned on to couple the output node to the reference node during an initial portion of a read operation and to decouple the output node from the reference node after an equalization delay period. A sense amplifier is enabled to provide a data output from the bit cell only after the delay period and decoupling of the output node from the reference node to provide balanced sensing speed of data represented by parallel and antiparallel state magnetic tunnel junctions (MTJs).

17 Claims, 9 Drawing Sheets

READ SENSING CIRCUIT AND METHOD WITH EQUALIZATION TIMING

CROSS-REFERENCE TO RELATED APPLICATIONS

This application claims the benefit of U.S. Provisional Patent Application No. 61/435,185 entitled Read Sensing Circuit and Method with Equalization Timing filed on Jan. 21, 2011 the disclosure of which is expressly incorporated herein by reference in its entirety.

TECHNICAL FIELD

The present disclosure generally relates to magnetic random access memory (MRAM). More specifically, the present disclosure relates to read sensing circuitry in MRAM.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two layers has at least one pinned magnetic polarization (or fixed layer) set to a particular polarity. The magnetic polarity of the other magnetic layer (or free layer) is altered to represent either a "1" (e.g., anti-parallel to the fixed layer) or "0" (e.g., parallel to the fixed layer). One such device having a fixed layer, a tunneling layer, and a free layer is a magnetic tunnel junction (MTJ). The electrical resistance of an MTJ is dependent on the magnetic polarity of the free layer compared to the magnetic polarity of the fixed layer. A memory device such as MRAM is built from an array of individually addressable MTJs.

Figure 1:
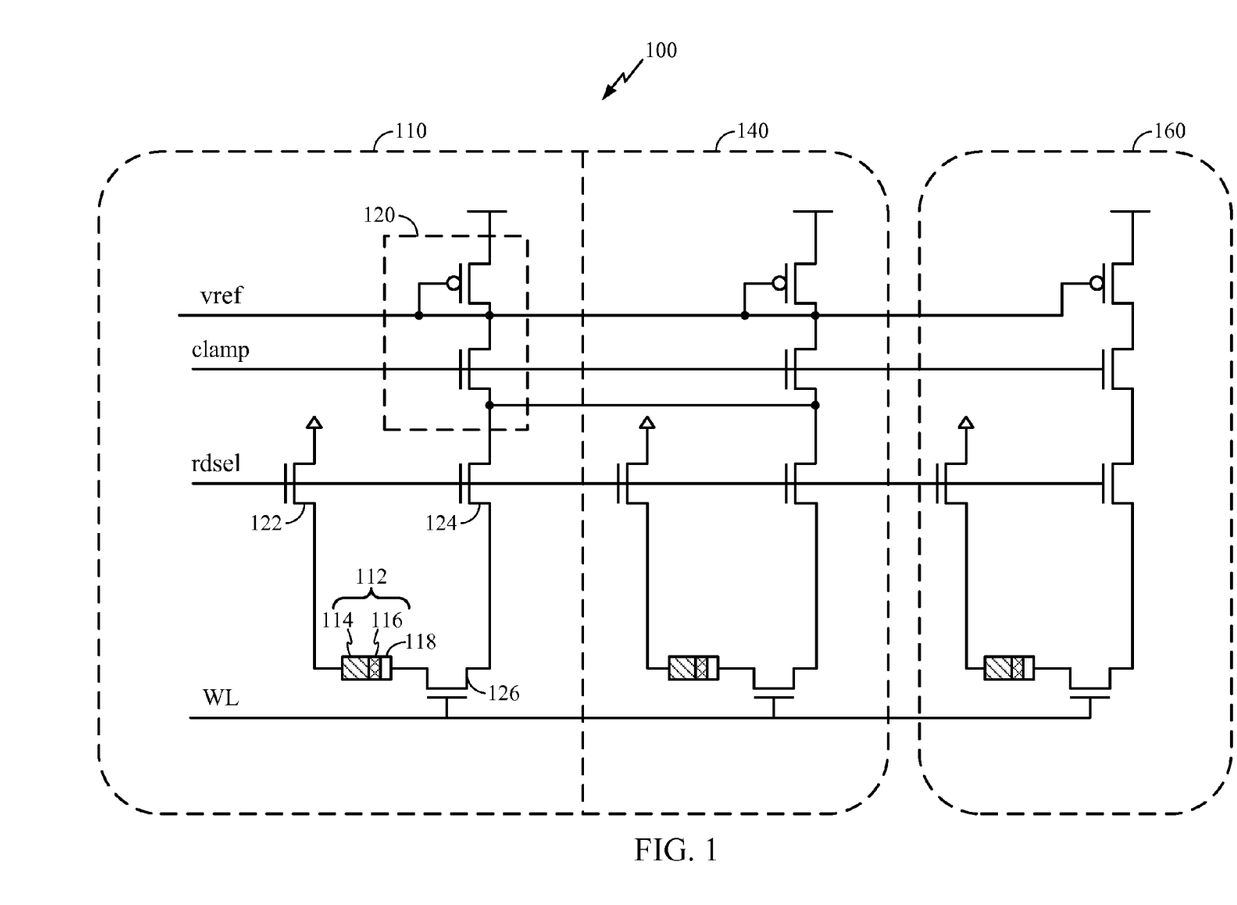
FIG. 1 is a circuit schematic illustrating a portion of a conventional magnetic random access memory (MRAM).

FIG. 1 is a circuit schematic illustrating a portion of a conventional magnetic random access memory (MRAM). An MRAM 100 is divided into a data circuit 160, and reference circuits 140, 110, each circuit 110, 140, 160 including multiple bit cells 112, 126 (only a single bit cell is illustrated to facilitate understanding). During read out of the bitcell of the data circuit 160, the resistance of the magnetic tunnel junction is compared to the effective resistance of two reference MTJs connected in parallel, where one is the reference parallel MTJ of the reference circuit 110 and the other is the reference anti-parallel MTJ of the circuit 140. Resistance of the bitcells are measured by applying a source voltage and determining an amount of current flowing through the bitcells. For example, in the bitcell of the parallel reference circuit 110, a current source 120 is applied to a magnetic tunnel junction (MTJ) 112 by read select transistors 122, 124, and a word line select transistor 126. The MTJ 112 includes a fixed layer 114, tunneling layer 116, and a free layer 118. When the free layer 118 and the fixed layer 114 have magnetizations aligned substantially parallel, the resistance of the MTJ 112, and thus the bitcell 110, is low. When the free layer 118 and the fixed layer 114 have magnetizations aligned substantially anti-parallel, the resistance of the MTJ 112, and thus the bitcell 110, is high.

Bitcells of a magnetic random access memory may be arranged in one or more arrays including a pattern of memory elements (e.g., MTJ in case of MRAM). STT-MRAM (Spin-Transfer-Torque Magnetic Random Access Memory) is an emerging nonvolatile memory and its advantages of non-volatility, comparable speed to eDRAM (Embedded Dynamic Random Access Memory), smaller chip size compared to eSRAM (Embedded Static Random Access Memory), unlimited read/write endurance, and low array leakage current have opened a great opportunity to STT-MRAM (Spin-Transfer-Torque Magnetic Random Access Memory) as a universal working memory in SoC (System on Chip) design. Key design challenges of STT-MRAM in SoCs are to ensure reliable operations with very low read-disturbance failure rate and high macro yield from robust design.

In existing MRAM architecture, a reference level for read sensing is generated upon activation of a word line (WL) in the memory array and at the same time a sense amplifier output node starts to discharge. During the time it takes for the reference level to settle down to a target signal level, the sense amplifier output node signal level for an MRAM cell storing a data "0" or a data "1" drops below a reference level before settling back to its target level. For a data "0", this drop causes a fast sensing time but it causes a longer sensing time for reading a data "1."

BRIEF SUMMARY

Aspects of the present disclosure include a method of magnetic random access memory (MRAM) read sensing. The method includes the steps of coupling an output node of a data circuit of the MRAM to a reference node of a reference circuit of the MRAM and allowing an equalization delay time to elapse in response to a read enable signal of the MRAM. After the equalization delay time has elapsed, the method includes the step of decoupling the output node of the data circuit from the reference node of the reference circuit. A sense amplifier is turned on for a period after the output node is decoupled from the reference node to compare signals on the output node of the data circuit with signals on the reference node. The sense amplifier is then turned off and the output node of the data circuit can then be re-coupled to the reference node of the reference circuit.

According to one aspect of the disclosure, the equalization delay time expires at about a settling time of the reference node. The equalization delay time may be between about 1 nanosecond and about 2 nanoseconds, for example. The MRAM may be integrated into at least one of a mobile phone, a set top box, a music player, a video player, an entertainment unit, a navigation device, a computer, a hand-held personal communication systems (PCS) unit, a portable data unit, and a fixed location data unit.

Aspects of the present disclosure also include an apparatus for magnetic random access memory (MRAM) read sensing. The apparatus includes means for coupling an output node of a data circuit of the MRAM to a reference node of a reference circuit of the MRAM and means for allowing an equalization delay time to elapse in response to a read enable signal of the MRAM. The apparatus also includes means for decoupling the output node of the data circuit from the reference node of the reference circuit after the equalization delay time has elapsed.

Aspects of the present disclosure also include a memory which includes a memory array, a reference circuit and a data circuit coupled to the memory array and the reference circuit. The memory also includes an equalization circuit configured between an output of the data circuit and an output of the reference circuit. The equalization circuit is configured for coupling the output of the data circuit to the output of the reference circuit, allowing an equalization delay time to elapse in response to a read enable signal of the memory; and decoupling the output node of the data circuit from the output of the reference circuit after the equalization delay time has elapsed.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 2:
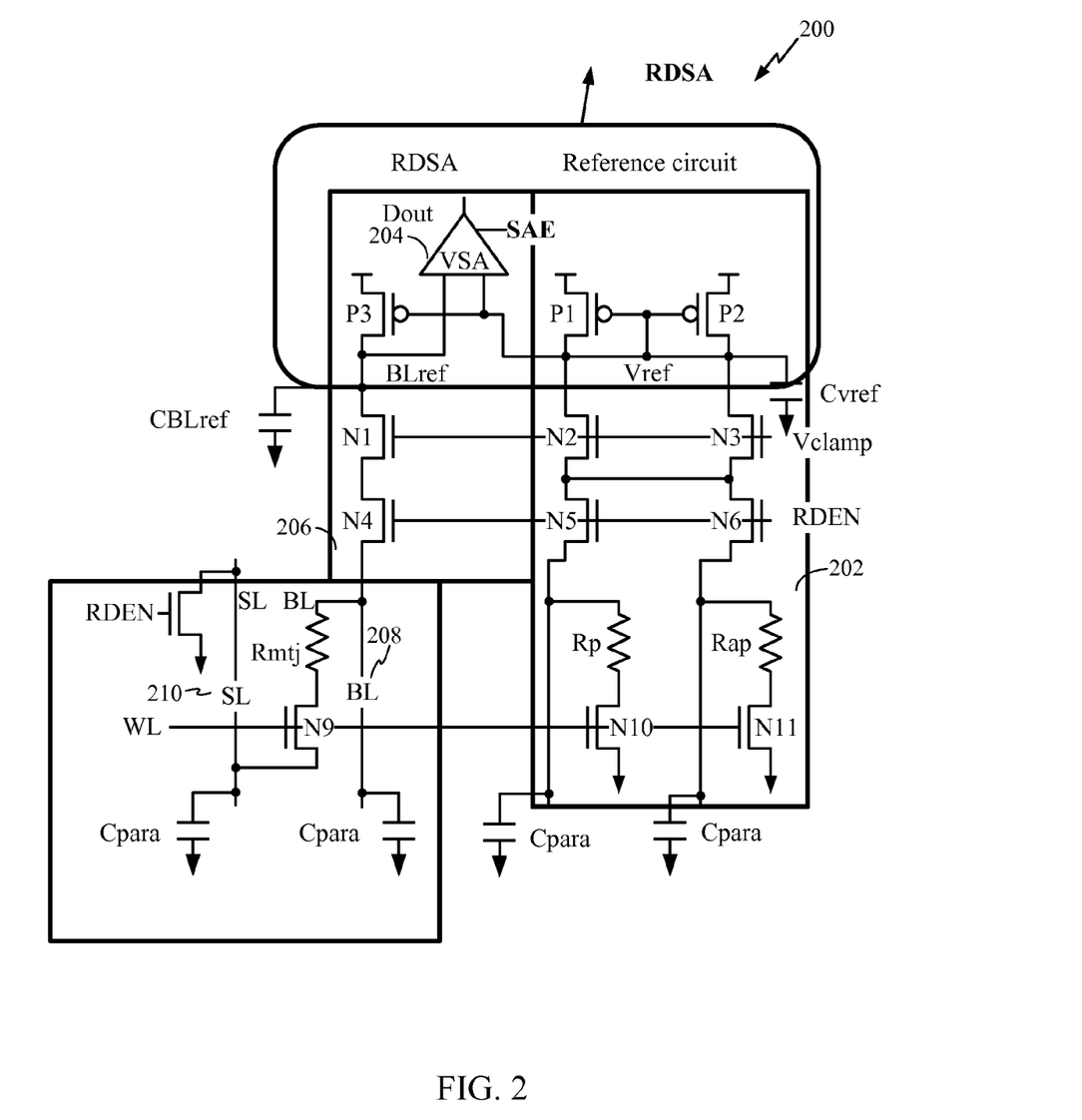
FIG. 2 is a circuit schematic illustrating read sensing circuitry for MRAM according to the PRIOR ART.

A read sensing circuit for an MRAM cell is described with reference to FIG. 2 in which a reference circuit generates a reference voltage to be compared with an output voltage from a data circuit including a memory cell array in a voltage sense amplifier (VSA). A read sensing circuit 200 includes a reference circuit portion 202 for generating the reference voltage level at node Vref for comparing with a bit line voltage level at node BLref (output) of a memory array 206. Node Vref and node BLref are coupled to a voltage sense amplifier 204 that compares signal levels on node Vref and node BLref to determine a state of an MTJ memory element Rmtj in the memory array 206. Although a single bit cell with an MTJ is shown, the memory array 206 includes numerous bit cells that will store data. The reference circuit portion 202 includes a first current path through a first reference MTJ (Rp) that is fixed in a parallel low resistance state, and a second current path through a second reference MTJ (Rap) that is fixed in an anti-parallel high resistance state.

Components of the reference circuit portion 202 are very similar to components of the memory array 206 and are fabricated in close proximity to the memory array 206 so that conditions affecting the bit line reference level BLref are likely to similarly affect the reference voltage level Vref. Transistors P1, P2 and P3 are the same in general to provide the same current. Transistors P1, N2 and N5 in the first current path and transistors P2, N3 and N6 in the second current path are substantially identical to transistors P3, N1 and N4 in the memory cell except that the gate and drain nodes are connected together in the PMOS transistors P1 and P2 of the reference circuit.

When the word line WL and read enable RDEN of the memory cell are asserted, the voltage sense amplifier 204 compares the bit line reference level BLref with the reference voltage level Vref to determine whether resistance of the memory element Rmtj indicates that the memory element Rmtj is in a parallel, low resistance state or an anti-parallel high resistance state. If the memory element Rmtj is in a low resistance state the voltage sense amplifier VSA provides a low signal output at the data out line (Dout). If the memory element Rmtj is in a high resistance state, the voltage sense amplifier VSA provides a high signal output at Dout.

During a precharge state, BLref and Vref are precharged to a high signal level because they are coupled to a power supply Vdd, for example. When RDEN (read enable) and WL are asserted, BLref drops below a target Vref level due to small parasitic capacitance (CBLref) of the output node BLref compared to the parasitic capacitance (Cvref) of the reference node Vref. The parasitic capacitance (Cveref) of the reference node Vref is bigger than CBLref because the Vref node is usually connected to inputs of a number of voltage sense amplifiers and also connected to the gate inputs of PMOS transistors in the data circuits e.g. P3 in FIG. 2. The read enable signal (RDEN) selects one of a number of columns in the memory array 206 and the word line signal (WL) selects a particular memory cell on the selected column. When the word line signal (WL) and read enable signal (RDEN) are enabled then both the BLref and Vref nodes start to settle down to their target levels. The target level of the reference voltage Vref may be around 0.8V. If Rmtj is in an anti-parallel state the target level of the output node BLref is about 1.4V. If Rmtj is in a parallel state the target level for the output node BLref is about 0.4V. The time for the output node BLref to reach its target level depends on whether the memory element Rmtj is in a parallel state (Rp) or in an anti-parallel state (Rap).

The BLref node drops below a target Vref level regardless of the data MTJ state if the parasitic capacitance (CBLref) is smaller than the parasitic capacitance Cvref. This drop helps data "0" sensing but it causes a longer sensing time for data "1" because the BLref node has to recover back to its target level from the dropped level. As a result, the time to sense a data 1, i.e., anti-parallel, state of the memory element is longer than the time to sense a data 0, i.e., parallel state of the memory element. This discrepancy causes a loss of some sensing time in the data 1 case.

Figure 3:
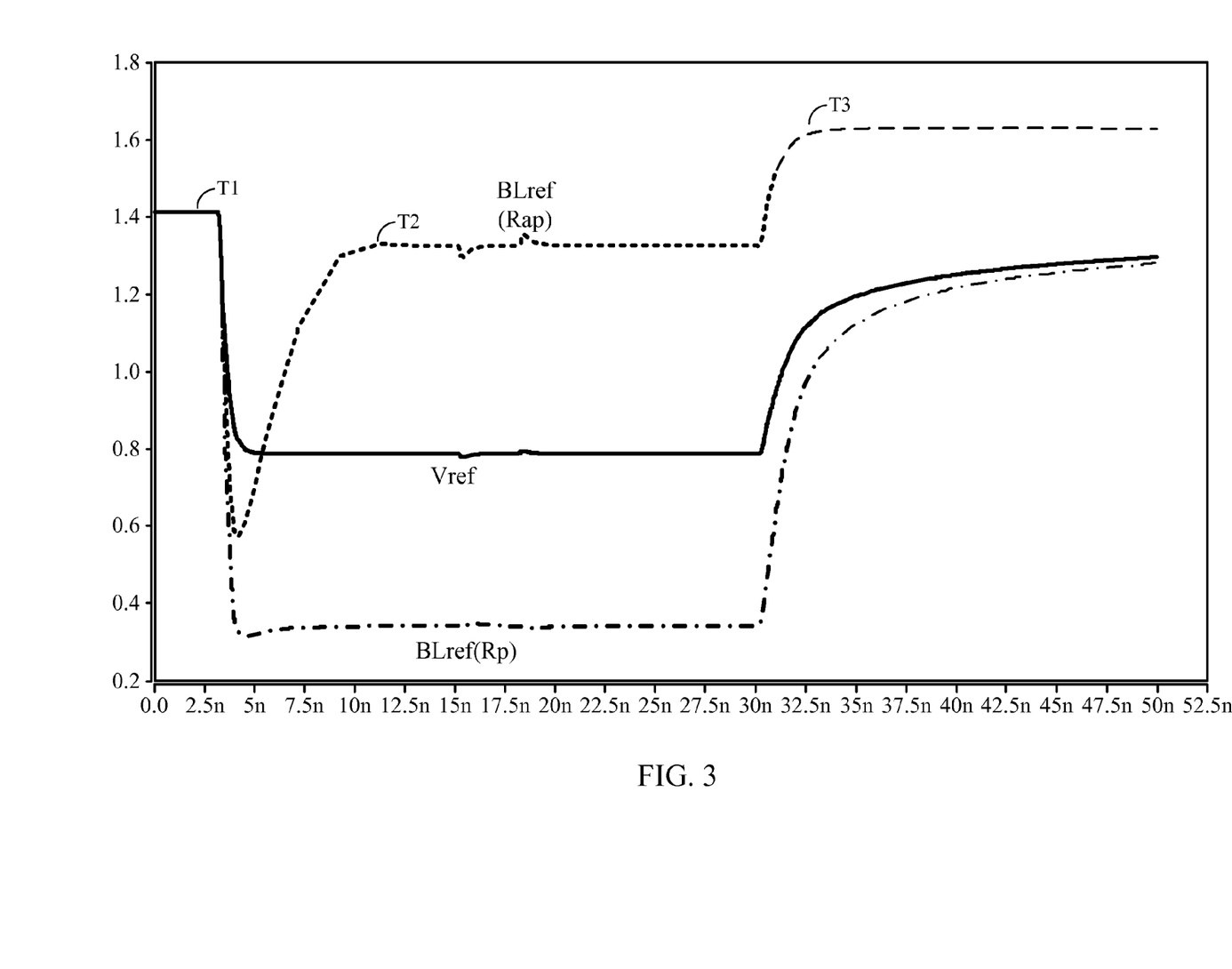
FIG. 3 is a signal level diagram illustrating signal levels in read sensing circuitry for MRAM according to the PRIOR ART.

Referring to FIG. 3, when the read enable signal (RDEN) is asserted at time T1, the reference voltage Vref quickly settles to its target level of about 0.8 volts. If the memory element Rmtj is in a parallel state, indicating that data value of 0 is stored, the output node BLref quickly falls to its target level of about 0.4 volt. If the memory element Rmtj is in the anti-parallel state, indicating that data value of 1 is stored, the output node BLref first falls below the level of Vref before charging to its target level of about 1.4 volts at time T2. When the read enable signal (RDEN) is de-asserted at time T3, the nodes BLref and Vref are again pre-charged toward Vdd. The additional time for the output node BLref to settle toward its target level when the memory element Rmtj is in an anti-parallel state as compared to the time for the output node BLref to settle toward its target level when the memory element Rmtj is in a parallel state is problematic.

Aspects of the present disclosure substantially reduce or eliminate the difference between time for the output node BLref to settle to its target level when Rmtj is in a parallel state and time for the BLref node to settle to its target level when Rmtj is in an antiparallel state by providing an equalization device, such as switching transistor circuitry, for example, between the BLref and Vref nodes. The equalization device acts as a closed switch between the BLref and Vref nodes and causes them to have a common signal level for a settling time tS until the Vref node is settled. When the Vref node is settled, the equalization device acts as an open switch and allows the BLref node to reach its target level. This balances sensing speed when reading data 0 and data 1, improves read speed and reduces sense margin variation in MRAM. The same read sensing speed may be achieved regardless of precharge time of the output node BLref and the reference node Vref.

Figure 4:
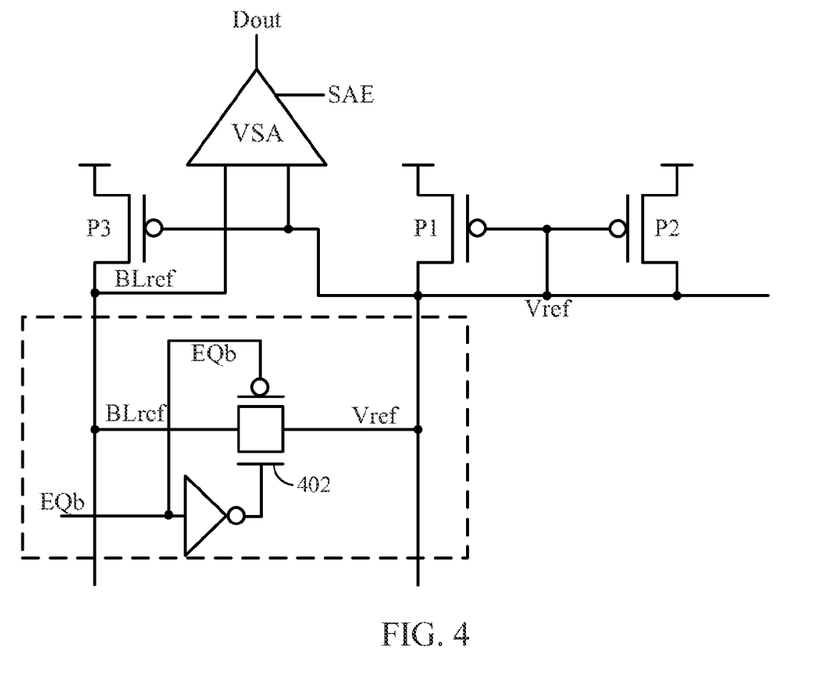
FIG. 4 is a circuit schematic illustrating equalization circuitry for read sensing in MRAM according to one aspect of the present disclosure.

Referring to FIG. 4, an aspect of the present disclosure includes coupling an equalization device 402, such as an equalization transistor, between the output node BLref and the reference node Vref. For example, the equalization device 402 may be coupled between the gate of transistor P1 and the gate of transistor P3. During the pre-charged state of the BLref node and the Vref node, the equalization device 402 is turned on by a signal on the EQb node. In this state, the equalization transistor behaves as a diode, like transistors P1 and P2 which have their gate and drain terminals connected together.

Figure 5:
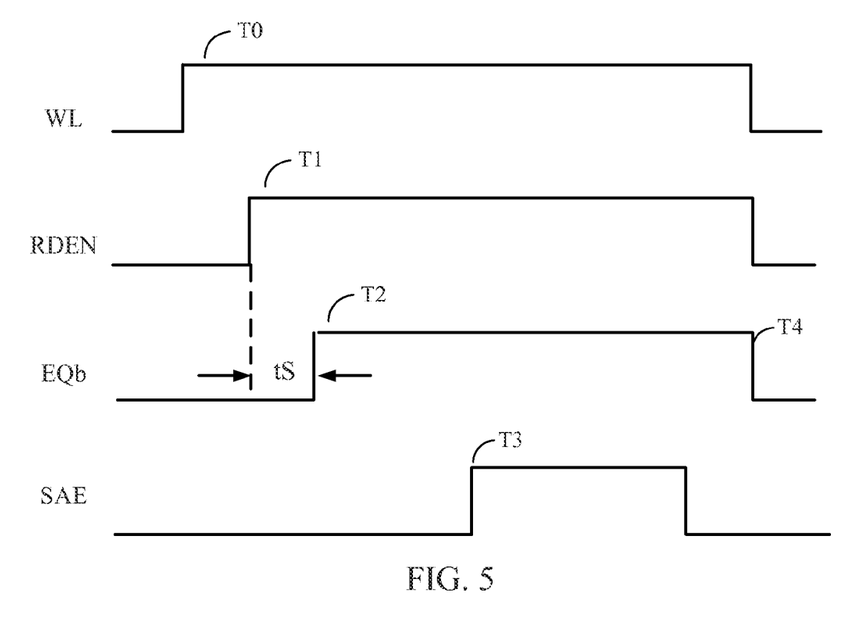
FIG. 5 is a timing diagram illustrating control signal waveforms for read sensing in MRAM according to aspects of the present disclosure.
Figure 6:
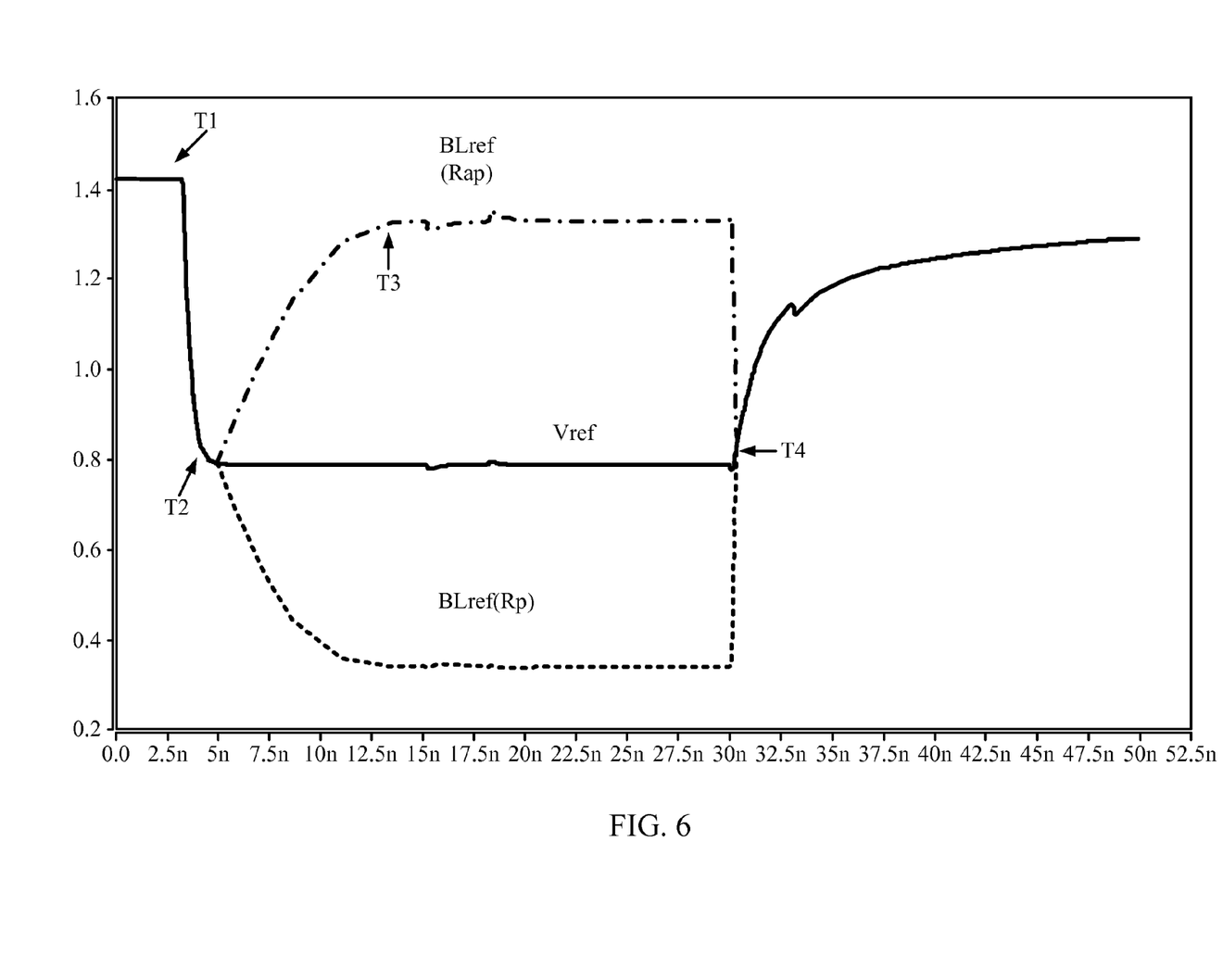
FIG. 6 is a signal level diagram illustrating equalized signal levels in read sensing circuitry provided by aspects of the present disclosure as compared to the PRIOR ART.

Operation of the equalization device according to an aspect of the present disclosure is described with reference to FIGS. 4, 5 and 6. To perform a memory read operation, first the word line signal (WL) is enabled at time T0, then the read enable signal (RDEN) is enabled at time T1. At this point, the equalization device 402 (FIG. 4) is still turned on so that the BLref and the Vref nodes are connected together, resulting in a common voltage. The signal levels of the BLref node and the Vref node starts to drop from the precharged level. After an equalization delay time tS, i.e., at time T2, the EQb signal is asserted, to turn off the equalization device 402 (FIG. 4) decoupling the BLref node from the Vref node. Aspects of the present disclosure provide the intentional delay tS of one or two nanoseconds, for example between times T1 and T2 even though the read enable signal (RDEN) is enabled.

At time T3 the BLref node and the Vref node have settled at or near their target levels. At this time the sense amplifier SAE (FIG. 4) can be enabled by asserting the SAE (sense amplifier enable) signal. When the SAE signal is asserted, the sense amplifier SAE (FIG. 4) compares the signal levels on the BLref node and the Vref node to provide a read data output in accordance with the state of the MTJ of the memory cell. At time T4 after the sense amplifier SAE is deactivated, the equalization device 402 is turned on re-coupling the BLref and Vref nodes. Using this scheme, the sensing speed of the data 0 and data 1 stored in an MRAM may be very balanced and the initial drop on the BLref node can be reduced or eliminated.

Figure 7:
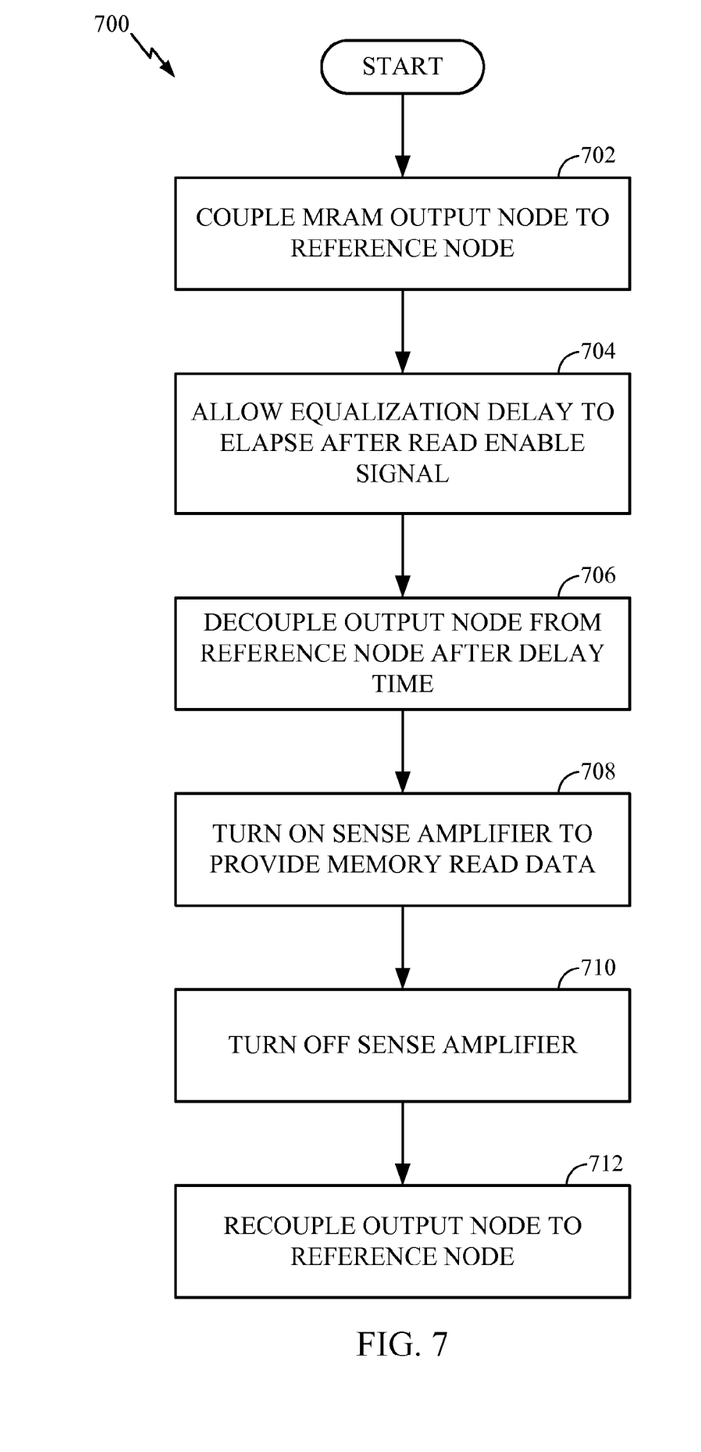
FIG. 7 is a process flow diagram illustrating a method for providing balance read sensing of a memory according to aspects of the present disclosure.

A method 700 of MRAM read sensing according to an aspect of the present disclosure is described with reference to FIG. 7. At block 702, the method includes coupling an output node of a data circuit of the MRAM to a reference node of a reference circuit of the MRAM. At block 704 an equalization delay time is allowed to elapse in response to a read enable signal of the MRAM. According to one aspect of the disclosure the equalization delay time expires at about the settling time of the reference node. In one example, the equalization time may be between about one nano second or about two nanoseconds.

At block 706, the method includes decoupling the output node of the data circuit from the reference node of the reference circuit after the equalization delay time has elapsed. At block 708, the method may include turning on a sense amplifier to compare signals, after the equalization delay time expires at about the settling time of the reference node. The sense amplifier compares signals from the output node with signals from the reference node for a period after the output node is decoupled from the reference node. At block 710, the method includes turning off the sense amplifier. At block 712, the output node of the data circuit is re-coupled to the reference node after turning off the sense amplifier.

Figure 8:
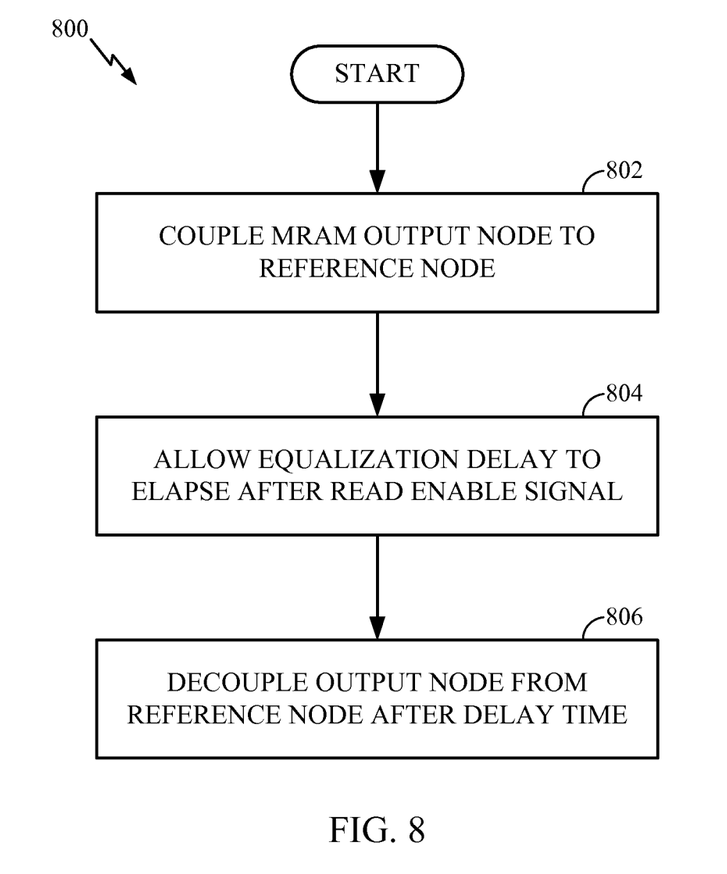
FIG. 8 is a process flow diagram illustrating a method for providing balanced read sensing of a memory according to aspects of the present disclosure.

A method 800 of MRAM read sensing according to an aspect of the present disclosure is described with reference to FIG. 8. At block 802, the method includes coupling an output node of a data circuit of the MRAM to a reference node of a reference circuit of the MRAM. At block 804 an equalization delay time is allowed to elapse in response to a read enable signal of the MRAM. At block 806, the method includes decoupling the output node of the data circuit from the reference node of the reference circuit after the equalization delay time has elapsed.

Figure 9:
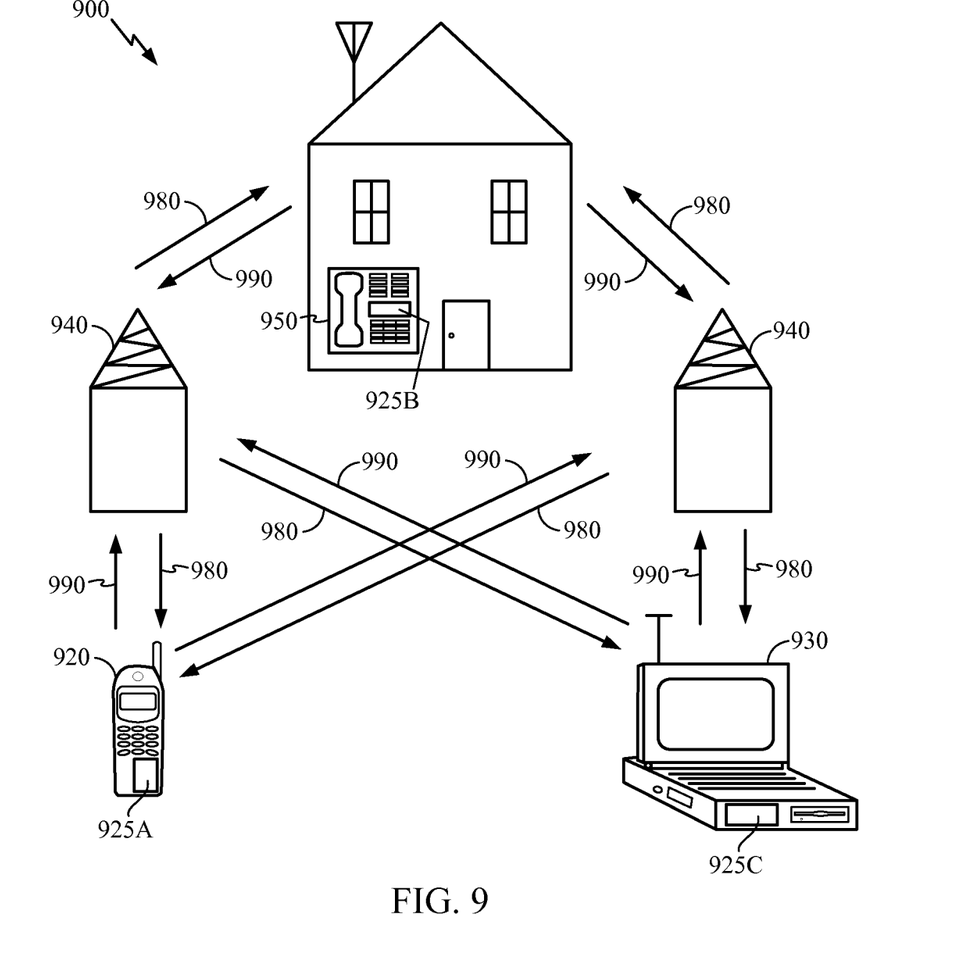
FIG. 9 is a block diagram showing an exemplary wireless communication system in which an embodiment of the disclosure may be advantageously employed.

FIG. 9 is a block diagram showing an exemplary wireless communication system 900 in which an embodiment of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C and 925B, that include the disclosed MRAM. It will be recognized that other devices may also include the disclosed MRAM, such as the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 9 illustrates remote units according to the teachings of the disclosure, the disclosure is not limited to these exemplary illustrated units. Embodiments of the disclosure may be suitably employed in any device which includes MRAM.

Figure 10:
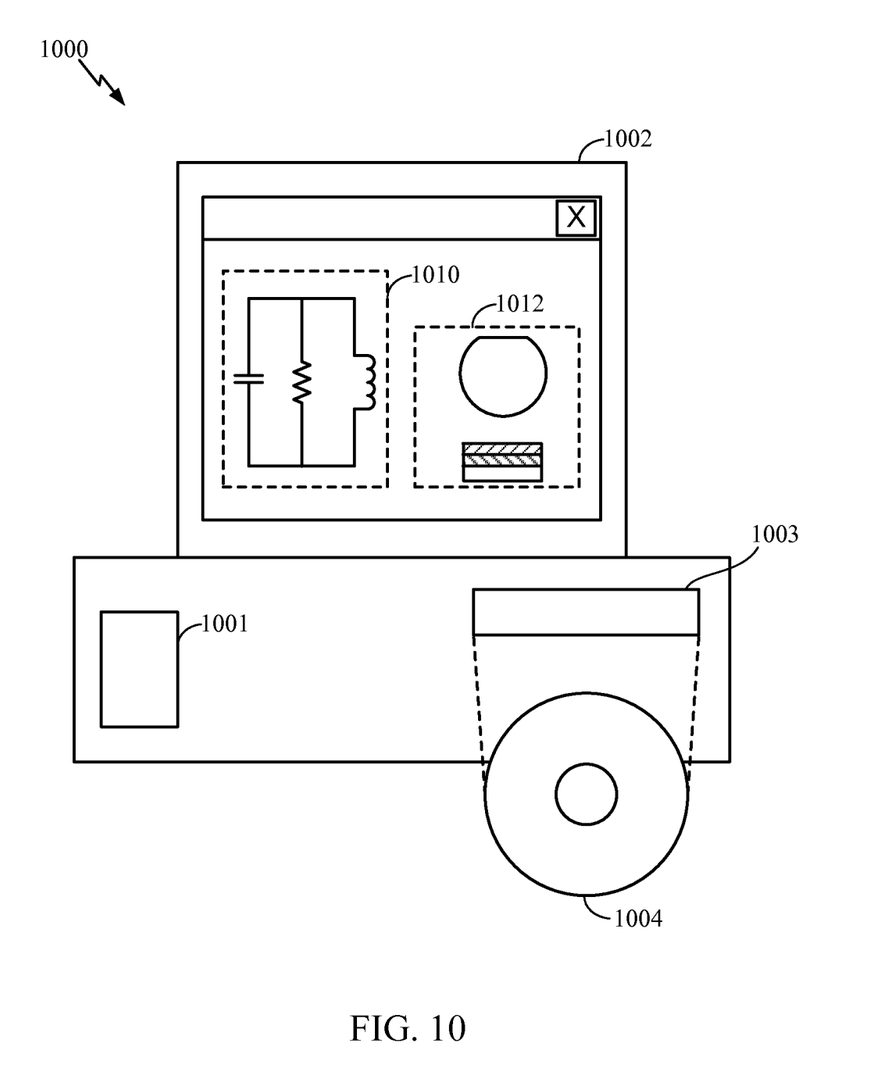
FIG. 10 is a block diagram illustrating a design workstation used for circuit, layout, and logic design of a semiconductor component according to one embodiment.

FIG. 10 is a block diagram illustrating a design workstation used for circuit, layout, and logic design of a semiconductor component, such as the MRAM disclosed above. A design workstation 1000 includes a hard disk 1001 containing operating system software, support files, and design software such as Cadence or OrCAD. The design workstation 1000 also includes a display to facilitate design of a circuit 1010 or a semiconductor component 1012 such as an MRAM. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of magnetic random access memory (MRAM) read sensing, comprising:
   coupling an output node of a data circuit of the MRAM to a reference node of a reference circuit of the MRAM, the data circuit comprising a selected data bit line and the reference circuit comprising a reference bit line coupled to the reference node;
   coupling the data bit line and the reference bit line to a current source in response to a read enable signal of the MRAM;
   allowing an equalization delay time to elapse in response to the read enable signal of the MRAM;
   decoupling the output node of the data circuit from the reference node of the reference circuit after the equalization delay time has elapsed; and
   turning on a voltage sense amplifier to compare signals on the output node of the data circuit with signals on the reference node for a period after the output node is decoupled from the reference node.

2. The method of claim 1, further comprising:
   turning off the sense amplifier; and
   re-coupling the output node of the data circuit to the reference node of the reference circuit after turning off the sense amplifier.

3. The method of claim 1, in which the equalization delay time is predetermined to elapse when the reference node settles at a target level.

4. The method of claim 1, in which the equalization delay time is between about 1 nanosecond and about 2 nanoseconds.

5. The method of claim 1, further comprising:
   integrating the MRAM into a mobile phone, a set top box, a music player, a video player, an entertainment unit, a navigation device, a computer, a hand-held personal communication systems (PCS) unit, a portable data unit, and/or a fixed location data unit.

6. An apparatus for magnetic random access memory (MRAM) read sensing, comprising:
- means for coupling an output node of a data circuit of the MRAM to a reference node of a reference circuit of the MRAM, the data circuit comprising a selected data bit line and the reference circuit comprising a reference bit line coupled to the reference node;
- means for coupling the data bit line and the reference bit line to a current source in response to a read enable signal of the MRAM;
- means for allowing an equalization delay time to elapse in response to the read enable signal of the MRAM;
- means for decoupling the output node of the data circuit from the reference node of the reference circuit after the equalization delay time has elapsed; and
- means for turning on a voltage sense amplifier to compare signals on the output node of the data circuit with signals on the reference node for a period after the output node is decoupled from the reference node.

7. The apparatus of claim 6, further comprising:
- means for turning off the sense amplifier; and
- means for re-coupling the output node of the data circuit to the reference node of the reference circuit after the sense amplifier is off.

8. The apparatus of claim 6, in which the equalization delay time is predetermined to elapse when the reference node settles at a target level.

9. The apparatus of claim 6, in which the equalization delay time is between about 1 nanosecond and about 2 nanoseconds.

10. The apparatus of claim 6, integrated into a mobile phone, a set top box, a music player, a video player, an entertainment unit, a navigation device, a computer, a hand-held personal communication systems (PCS) unit, a portable data unit, and/or a fixed location data unit.

11. A method of magnetic random access memory (MRAM) read sensing, comprising steps of:
- coupling an output node of a data circuit of the MRAM to a reference node of a reference circuit of the MRAM, data circuit comprising a selected data bit line and the reference circuit comprising a reference bit line coupled to the reference node;
- coupling the data bit line and the reference bit line to a current source in response to a read enable signal of the MRAM;
- allowing an equalization delay time to elapse in response to the read enable signal of the MRAM;
- decoupling the output node of the data circuit from the reference node of the reference circuit after the equalization delay time has elapsed; and
- turning on a voltage sense amplifier to compare signals on the output node of the data circuit with signals on the reference node for a period after the output node is decoupled from the reference node.

12. The method of claim 11, further comprising the steps of:
- turning off the sense amplifier; and
- re-coupling the output node of the data circuit to the reference node of the reference circuit after turning off the sense amplifier.

13. The method of claim 11, in which the equalization delay time is predetermined to elapse when the reference node settles at a target level.

14. The method of claim 11, in which the equalization delay time is between about 1 nanosecond and about 2 nanoseconds.

15. The method of claim 11, further comprising the step of:
- integrating the MRAM into a mobile phone, a set top box, a music player, a video player, an entertainment unit, a navigation device, a computer, a hand-held personal communication systems (PCS) unit, a portable data unit, and/or a fixed location data unit.

16. A magnetic random access memory (MRAM), comprising:
- a reference circuit compromising a reference bit line coupled to an output of the reference circuit;
- a data circuit coupled to the reference circuit, the data circuit comprising a selected data bit line; and
- an equalization circuit configured between an output of the data circuit and the output of the reference circuit, the equalization circuit configured:
  - to couple the output of the data circuit to the output of the reference circuit;
  - to couple the data bit line and the reference bit line to a current source in response to a read enable signal of the MRAM;
  - to allow an equalization delay time to elapse in response to the read enable signal of the MRAM;
  - to decouple the output node of the data circuit from the output of the reference circuit after the equalization delay time has elapsed; and
  - to turn on a voltage sense amplifier to compare signals on the output node of the data circuit with signals on the output of the reference circuit for a period after the output node is decoupled from the output of the reference circuit.

17. The MRAM of claim 16, integrated into a mobile phone, a set top box, a music player, a video player, an entertainment unit, a navigation device, a computer, a hand-held personal communication systems (PCS) unit, a portable data unit, and/or a fixed location data unit.

* * * * *